United States Patent
Ishibashi et al.

(10) Patent No.: US 6,222,203 B1
(45) Date of Patent: Apr. 24, 2001

(54) SELFLUMINOUS DISPLAY DEVICE HAVING LIGHT EMISSION SOURCES HAVING SUBSTANTIALLY NON-OVERLAPPING SPECTRA LEVELS

(75) Inventors: Akira Ishibashi; Norikazu Nakayama, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/878,418

(22) Filed: Jun. 18, 1997

(30) Foreign Application Priority Data

Jun. 18, 1996 (JP) .................................................. 8-177496

(51) Int. Cl.[7] ..................................................... H01L 33/00
(52) U.S. Cl. ................................ 257/88; 257/89; 257/90; 257/103
(58) Field of Search ................................. 257/88, 89, 90, 257/103, 79; 372/43, 45

(56) References Cited

U.S. PATENT DOCUMENTS 5,650,641 * 7/1997 Sassa et al. .............................. 257/88
5,739,552 * 4/1998 Kimura et al. .......................... 257/89

* cited by examiner

*Primary Examiner*—Minh Loan Tran
(74) *Attorney, Agent, or Firm*—Sonnenschein, Nath & Rosenthal

(57) ABSTRACT

A selfluminous display device having distinct blue (B), green (G) and red (R) light emission sources wherein the spectra of the light emission sources each have a narrow half band width (30 nm or less) at a level regarded as precursor delta functions, which do not mutually substantially overlap. Because light sources having spectra of limited peak values and extremely narrow limited widths are used, shape changes of the spectrum in each light source are suppressed in the wavelength space and can be regarded as purely magnitude changes. Therefore, it becomes possible to correct just by changing the strength for each light emission source, color reproducibility increases and there ceases to be any change over time in the colors.

14 Claims, 8 Drawing Sheets

SELFLUMINOUS DISPLAY DEVICE HAVING LIGHT EMISSION SOURCES HAVING SUBSTANTIALLY NON-OVERLAPPING SPECTRA LEVELS

BACKGROUND OF THE INVENTION

1. Field of the Invention

The present invention relates generally to the field of display devices, and, more particularly, the present invention relates to a selfluminous display device which has a plurality of light emission sources consisting of, for example, semiconductor lasers or light emitting diodes.

2. Description of the Related Art

Conventional display devices include stationary type Braun tube i.e. CRT (Cathode Ray Tube) devices and flat panel displays (FPD) which fulfil the requirements of portable uses and the realization of thin displays. Examples of flat panel displays include liquid crystal displays (LCD). In these display devices, the LCD itself does not emit light but employs backlighting for the display of information. In contrast, a CRT is a selfluminous display device which includes a luminescent substance that emits light itself.

Currently, in the audio field digital sound sources from which noise has been removed have been established for a long time, but in display devices they have not been established, and the demand for noiseless clear color reproduction, i.e. for digital reproduction is increasing. However, in a conventional selfluminous display device, it was difficult to make the digital reproducibility good. This point will be explained below.

FIG. 10 shows the range reproducible by a CRT based on the NTSC (National Television System Committee) format. As is clear also from this figure, with a CRT using luminescent substances it is only possible to reproduce the inside of the triangle (CRT) shown with single-dotted chain lines. The reason why the triangle (CRT) is primarily near the center is because the spectra of the luminescent substances are wide, the color purity is bad and approaches white. Also, the width is wide because in the luminescent substances there are many transition order levels of slightly different energies and there is a distribution in the transition energy. However, due to change over time and the like this transition order level distribution changes and the color reproducibility deteriorates. Also, there is a problem that because of this wide spectrum width the color purity deteriorates and also the reproduction range narrows. A triangle (LED) shown with solid lines shows the reproducible region of the present invention discussed later.

FIG. 11 shows the relationship between light emission wavelength ($\lambda$) and light emission strength in conventional red (R), green (G) and blue (B) light emission sources for a CRT, and in this case, the display strength ($F_{NTSC}$) of a selfluminous display device in which these light emission sources are used can be expressed with the following expression.

$$F_{NTSC} = \sum_i (b_i B + g_i G + r_i R)$$

B, G, R light emission strength
$b_i$, $g_i$, $r_i$ coefficients

The spectra of the light emission strengths of these RGB light emission sources change due to deterioration of the respective light sources from the state shown with solid lines to the state shown with broken lines. Because as is clear also from this figure, the widths of the spectrum shapes are wide and also the changes thereof are not uniform, correcting the display strength ($F_{NTSC}$) is difficult, and consequently as described above there has been the problem that the color reproducibility deteriorates.

Also in a flat panel display device in which a liquid crystal display (LCD) is used, in the transmission spectrum of the color filter there is a width for obtaining a limited strength, and consequently, the same problems exist as in the CRT case described above. In particular, there has been the problem that it is only possible to reproduce the inside of the triangle (LCD) shown with single-dotted chain lines in FIG. 10 and the reproducibility is bad. Conversely, there has been the problem that when a filter having a narrow transmission spectrum band is used in order to raise the color purity, the transmitted light strength falls significalty.

SUMMARY OF THE INVENTION

The present invention was made in view of these problem points, and an object of the invention is to make light emission strength a sole parameter and provide a selfluminous display device having a wider range of color reproducibility and also one in which it is possible to obtain a light emission strength having no change over time.

A selfluminous display device of the present invention comprises a plurality of light emission sources respectively having spectra of such levels that they do not mutually substantially overlap. The plurality of light emission sources, specifically, red, green and blue semiconductor light emitting devices (LED, LD) respectively have precursor delta function shaped spectra with a half band width 30 nm or less. Alternately, red, green and blue semiconductor lasers (LD) or light emitting diodes(LED) respectively having spectra in which the half band width of the envelope function is 30 nm or less are used. More specifically, gain guided wave type or refractive index guided wave type semiconductor lasers or light emitting diodes are used. These devices include on a substrate at least a clad layer and an active layer of a first conductivity type and a clad layer of a second conductivity type made from a group II–VI compound semiconductor or a group III–V compound semiconductor.

In a selfluminous display device of the present invention, because a plurality of light sources have spectra which do not mutually substantially overlap, i.e. light emission sources of extremely narrow limited widths, are used, the shape changes of the spectra are suppressed in the wavelength space and they can be seen as magnitude changes only. Thus, correction having only magnitude as a parameter becomes possible.

DETAILED DESCRIPTION OF THE PREFERRED EMBODIMENTS

Figure 2:
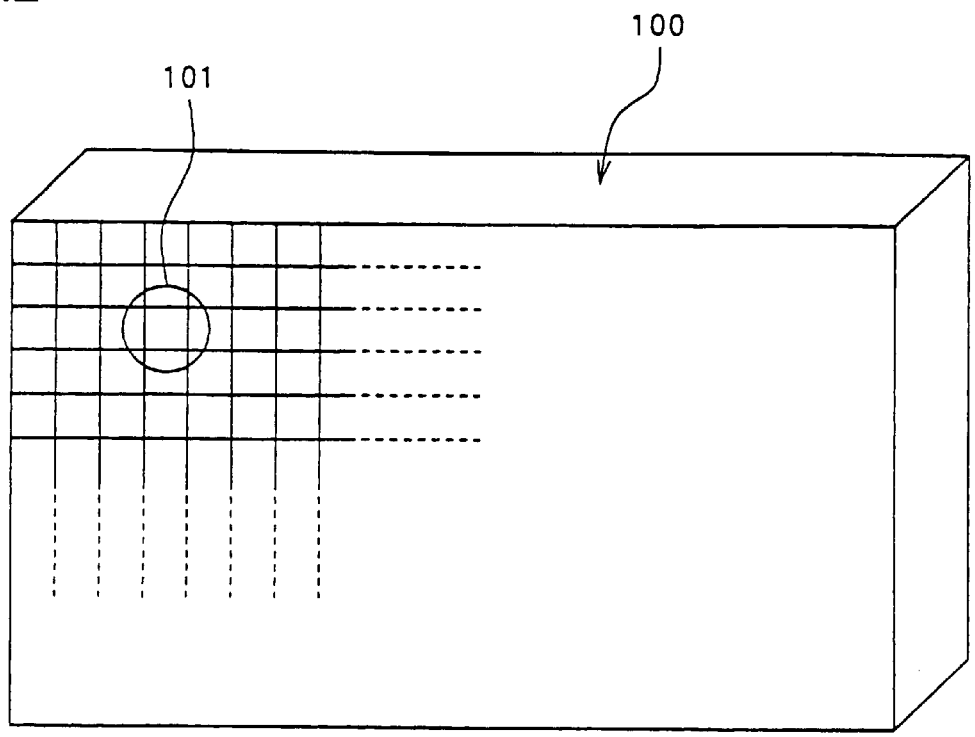
FIG. 2 is a perspective view showing the external appearance construction of a selfluminous display device of the present invention.
Figure 3:
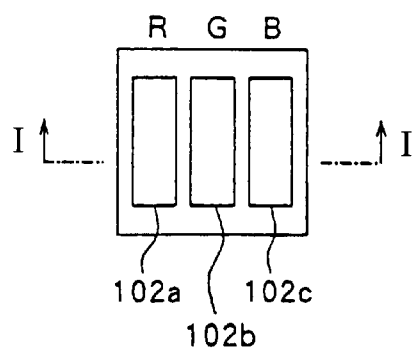
FIG. 3 is a plan view showing a sub-unit constituting a part of the selfluminous display device of FIG. 2.
Figure 4A:
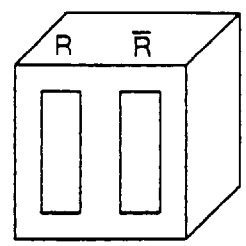
FIG. 4 is a plan view showing the construction of another sub-unit.
Figure 4B:
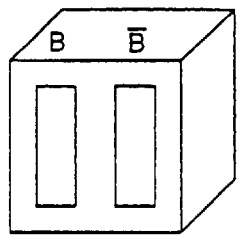
Figure 4C:
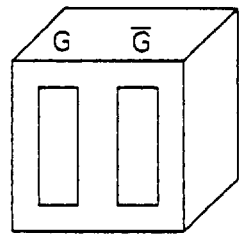
Figure 4D:
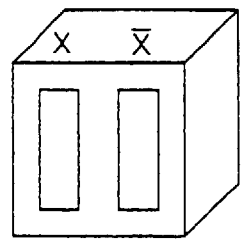
Figure 4E:
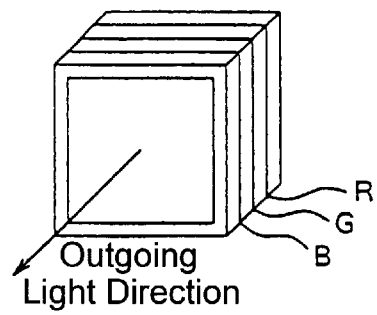
Figure 4F:
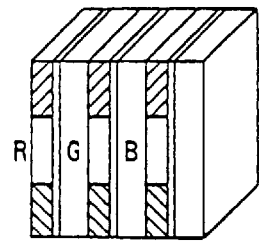

FIG. 2 shows the outline of a light emitting part 100 of a selfluminous display device according to a first embodiment of the present invention. This selfluminous display device may be a direct view type display device or a light source portion of a projection type display device. The light emitting part 100 is comprised of many sub-units 101. FIG. 3 shows an example of the specific construction of one sub-unit 101, and it comprises light emission sources 102a to 102c of for example the three primary colors of red (R), green (G) and blue (B). FIG. 4A to FIG. 4D show other examples of the sub-unit 101. It may be any of the forms of the combination of red (R) and a light emission source of another color ($\overline{R}$) shown in FIG. 4A of the figure, the combination of blue (B) and a light emission source of another color ($\overline{B}$) shown in FIG. 4B, the combination of green (G) and a light emission source of another color ($\overline{G}$) shown in FIG. 4C. Alternatively, it may be the combination of any color (X) and a light emission source of another color ($\overline{X}$) in FIG. 4D. The sub-unit 101 may also be comprised of a combination of light emission sources of four or more colors. Also, as shown in FIG. 4E and FIG. 4F it may have the form of a stack shape with the red (R), which has the smallest energy, stacked at the back side and the blue (B), which has the highest energy, at the front side. If it is this type of construction, it is possible to increase the definition by three times.

Figure 5:
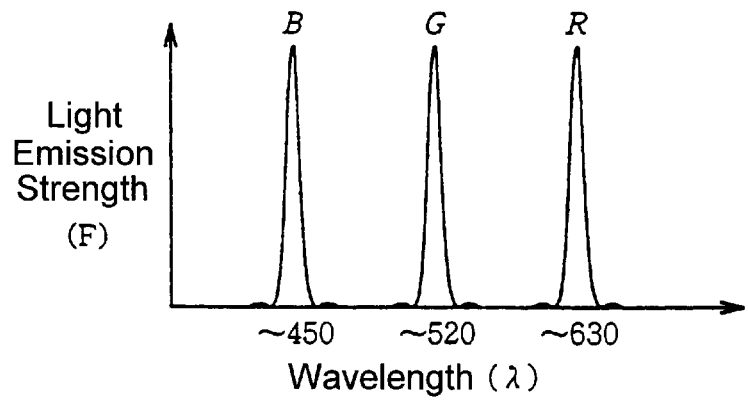
FIG. 5 is a characteristic view showing light emission spectra of RGB light sources which can be regarded as precursor delta functions used in the invention.

FIG. 5 shows the respective spectra of the three light emission sources 102a to 102c mentioned above. These spectra of the light emission sources 102a to 102c are of such a level that their half band widths are narrow (30 nm or less) and they do not mutually substantially overlap at a level such that they can be regarded as the precursor delta (δ) function of the following expression.

$$\delta(x) = \lim_{g \to \infty} [\sin(gx)/\pi x]$$

In the light emission sources 102a to 102c having this kind of precursor delta function shaped spectrum (that is, having limited peak values and extremely narrow limited widths), shape changes of the spectra are suppressed in the wavelength space and can be regarded as magnitude changes only.

Therefore, in a selfluminous display device according to this exemplary embodiment, it is possible to spectrum-display the display strength ($F_{DD}$) due to the three light emission sources 102a to 102c as the sum of mutually independent units as shown in the following expression. That is, changes in the spectrum shapes are in principle extremely small, in all of the light emission sources 102a to 102c it is possible to correct just by changing their respective strengths, and because of this the color reproducibility increases markedly and changes with time cease to exist.

$$F_{DD} = \sum_i (b_i B + g_i G + r_i R)$$

B, G, R light emission strength $b_i$, $g_i$, $r_i$ coefficients

Thus, in a selfluminous display device according to this exemplary embodiment, just with three parameters (the strengths of the three colors RGB) it is possible to reproduce all points on the chromaticity diagram with superior point precision, and it is possible to provide a noiseless clear display, i.e. reproduction of color digitally.

Figure 10:
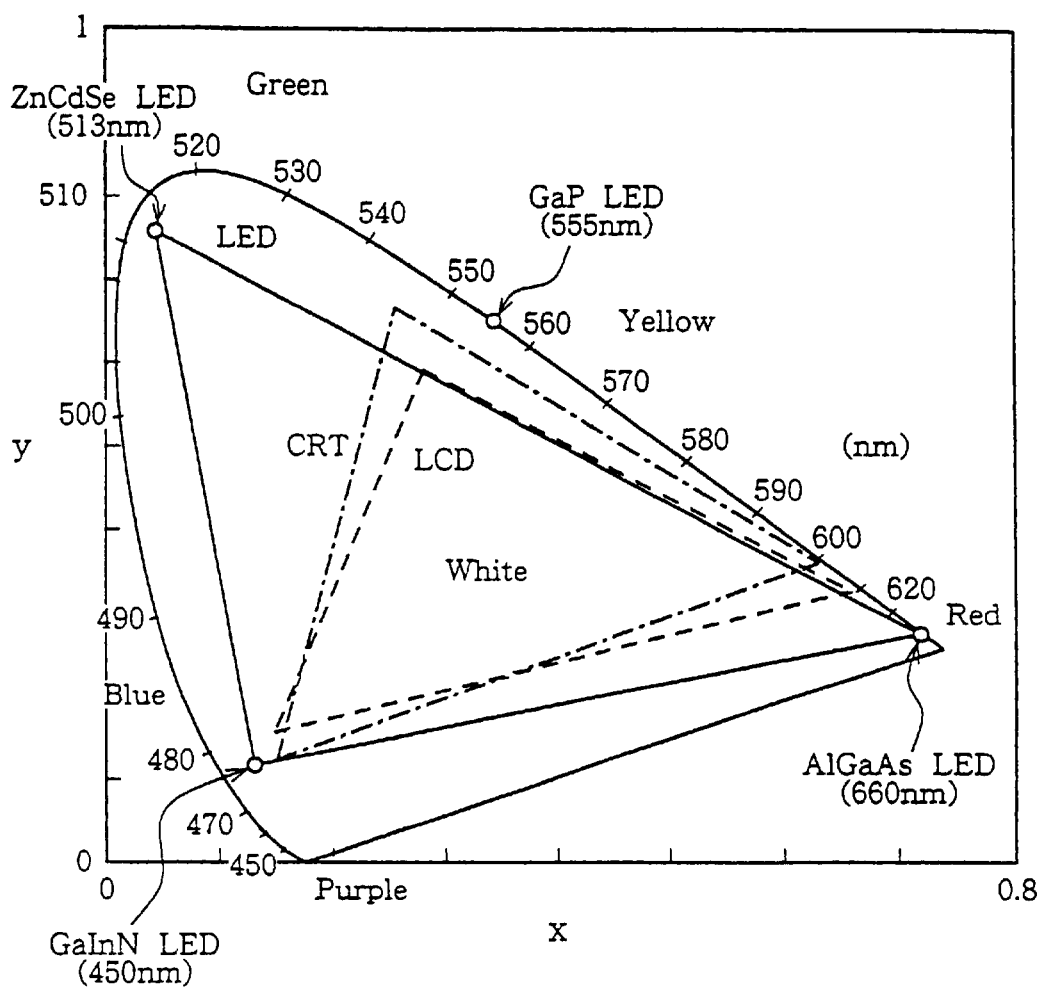
FIG. 10 is a chromaticity coordinates chart for comparing and explaining light emission characteristics of CRTs, LCDs and LEDs.
Figure 11:
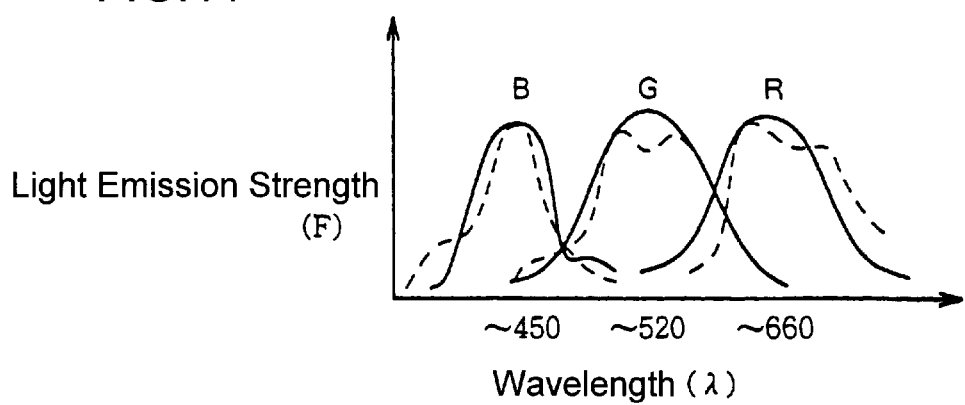
FIG. 11 is an illustrates which shows the light emission spectra of conventional RGB light sources.

Also, because the three light emission sources 102a to 102c used in this exemplary embodiment each have a precursor delta function shaped spectrum, they exist on the periphery of the chromaticity coordinates shown in FIG. 10. Therefore, it is possible to obtain the maximum color reproduction range allowed in theory (the triangle (LED) in the figure). In this example, the red light emission source 102a is a light emitting diode (LED) comprised of AlGaAs compound semiconductors. The green light emission source 102b is one comprised of ZnCdSe compound semiconductors and the blue light emission source 102c is one comprised of GaInN compound semiconductors and are respectively shown in the figure.

Figure 1:
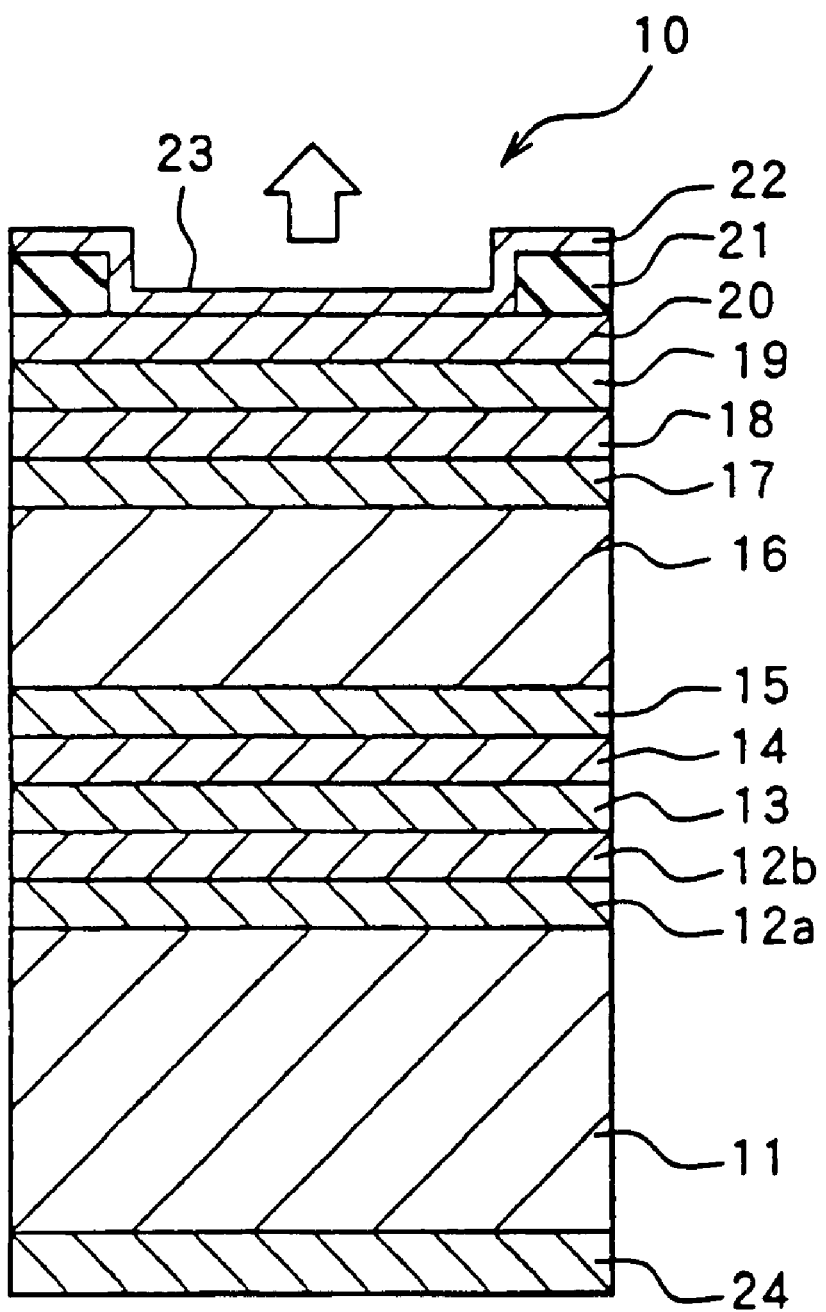
FIG. 1 is a sectional view showing a construction of a light emitting diode used in a selfluminous display device according to a first embodiment of the present invention.

The specific manufacture of the red, green and blue light emission sources 102a, 102b and 102c will now be described. FIG. 1 corresponds to the cross-sectional structure of along the line I—I in FIG. 3, and shows the construction of a surface emission type light emitting diode (LED) including a ZnCdMgSe cladding layer and a ZnCdMgSe active layer on an InP (Indium—Phosphorus) substrate as an example of a light emission source 102a, 102b, 102c.

That is, the light emitting diode 10 is made by successively growing on, for example, an n-type substrate 11 made of InP, an n-type clad layer 12 having a thickness of about 700 nm comprised of, for example, a ZnCdSe layer 12a with Cl (chlorine) doped as an n-type impurity and a $Zn_{x1}Cd_{y1}Mg_{1-x1-y1}Se$ (0≦x1, y1≦1) layer 12b with Cl doped as an n-type impurity, an n-type guide layer 13 having a thickness of about 100 nm comprised of, for example, $Zn_{x2}Cd_{y2}Mg_{1-x2-y2}Se$ (0≦x2, y2≦1) with Cl doped as an n-type impurity, an active layer 14 having a thickness of, for example, 6 to 12 nm comprised of $Zn_{x3}Cd_{y3}Mg_{1-x3-y3}Se$ (0≦x3, y3≦1) made a single or multiple quantum well structure, a p-type guide layer 15 having a thickness of about 100 nm, for example, comprised of $Zn_{x2}Cd_{y2}Mg_{1-x2-y2}Se$ (0≦x2, y2≦1) with N (nitrogen) doped as a p-type impurity, and a p-type clad layer 16 having a thickness of about 500 nm comprised of, for example, $Zn_{x1}Cd_{y1}Mg_{1-x1-y1}Se$ (0≦x1, y1≦1) with N doped as a p-type impurity. The n-type clad layer 12 and the p-type clad layer 16 each have a resistivity lower than the active layer 14 and perform the function of producing light as well as confining the light and carriers to the active layer 14.

Additional layers are successively grown on the p-type clad layer 16. These additional layers include a first semiconductor layer 17 having a thickness of, for example, 500 nm comprised of ZnCdMgSe doped with N as a p-type impurity. Additionally, a second semiconductor layer 18 having a thickness of about 100 nm comprised of ZnCdSe and a superlattice semiconductor layer 19 wherein ZnSe and CdSe are laminated alternately, and a contact layer 20 consisting of $Zn_xCd_{1-x}Se$ ($0 \leqq x \leqq 1$) doped with N. The first semiconductor layer 17, second semiconductor layer 18, superlattice semiconductor layer 19 and contact layer 20 provide good ohmic contact with a p-side electrode. An insulating layer 21 of polyimide resin or the like is formed on the contact layer 20, and an opening 21a which becomes a current passage region is formed in this insulating layer 21. A grill-like p-side electrode 22 comprised of laminated films of Pd (palladium), Pt (platinum) and Au (gold) is formed on the contact layer 20 including the insulating layer 21 to surround a light emission surface 23. Additionally, an n-side electrode 24 comprised of In (indium) or the like is formed on the rear side of the substrate 11.

This light emitting diode 10 may be manufactured, for example, by MBE (Molecular Beam Epitaxy) or MOCVD (Metal Organic Chemical Vapor Deposition). First, layers are grown on a substrate 11 comprised of n-type InP. An n-type clad layer 12 having a thickness about 700 nm comprised of, for example, a ZnCdSe layer 12a doped with Cl as an n-type impurity and a $Zn_{x1}Cd_{y1}Mg_{1-x1-y1}Se$ layer 12b similarly doped with Cl as an n-type impurity. Then an n-type guide layer 13 having a thickness of about 100 nm comprised of $Zn_{x2}Cd_{y2}Mg_{1-x2-y2}Se$ doped with Cl as an n-type impurity and an active layer 14 having a thickness of, for example, 6 to 12 nm comprised of $Zn_{x3}Cd_{y3}Mg_{1-x3-y3}Se$ comprised of a single or multiple quantum well structure are formed. Next, a p-type guide layer 15 having a thickness of about 100 nm comprised of, for example, $Zn_{x2}Cd_{y2}Mg_{1-x2-y2}Se$ doped with N as a p-type impurity and an p-type clad layer 16 of thickness about 500 nm comprised of, for example, $Zn_{x1}Cd_{y1}Mg_{1-x1-y1}Se$ doped with N as a p-type impurity are formed. When adding (doping) an n-type impurity (Cl) to an epitaxial growth layer, in addition to particle beams of group II elements and group VI elements, a particle beam of Cl may be used. Also, when adding the p-type impurity (N) to an epitaxial growth layer, in addition to particle beams of group II elements and group VI elements, a particle beam of N made a plasma generated by impressing a magnetic field and microwaves simultaneously may be used.

Then, further, layers for providing good ohmic contact with a p-side electrode are formed. Specifically, a first semiconductor layer 17 having a thickness of, for example, 500 nm comprised of ZnCdMgSe doped with N as a p-type impurity, a second semiconductor layer 18 having a thickness of about 100 nm comprised of ZnCdSe, and a superlattice semiconductor layer 19 wherein ZnSe and CdSe are laminated alternately, and a contact layer 20 comprised of $Zn_xCd_{1-x}Se$ doped with N are successively formed on the p-type clad layer 16.

Then, after an insulating layer 21 of polyimide resin or the like is formed by deposition on the contact layer 20 via photolithography or the like, a current passage portion, for example, in a pattern extending perpendicular to the paper surface of FIG. 1 shown as an opening 21a, is formed. A grill-like p-side electrode 22 made by successively laminating by sputtering or the like Pd, Pt, Au overall from the contact layer 20 side is formed, and a light emission surface 23 is formed by a lift-off method. On the other side, an n-side electrode 24 comprised of In or the like is formed by deposition on the rear side of the substrate 11.

In this light emitting diode 10, when a predetermined voltage is impressed across the p-side electrode 22 and the n-side electrode 24, a current is injected from the p-side electrode 22 into the contact layer 20. The current injected into the contact layer 20 passes through the superlattice semiconductor layer 19, the second semiconductor layer 18, the first semiconductor layer 17, the p-type clad layer 16 and the guide layer 15 and is injected into the active layer 14. In the active layer 14, light emission resulting from electron-hole recombination occurs, and this is taken out through the emission surface 23 to outside planarly in a perpendicular direction with respect to the main face of the substrate 11.

Because the second semiconductor layer 18 has the function of diffusing current injected into the contact layer 20 and causing current to be injected into a wide region of the active layer 14, when as mentioned above it consists of a ZnCdSe layer it is desirable that its thickness be thin (in this exemplary embodiment, 100 nm) to suppress absorption. In this case, it is necessary to make the first semiconductor layer (a ZnCdMgSe layer) 17, which similarly functions as a current diffusing layer, thick (in this exemplary embodiment, 500 nm). By adopting this kind of construction, sufficient holes reach the middle part of the light emission surface of the active layer 14 and uniform light emission is eassily achieved.

By this kind of action, in a light emitting diode 10 according to this exemplary embodiment, it is possible to achieve the green through blue precursor delta function shaped spectra shown in FIG. 5. When the active layer 14 is comprised of a ZnCdSe compound semiconductor, according to its composition it becomes a green through blue wavelength band (for example 512 nm), and when the active layer 14 is a ZnSe compound semiconductor it becomes a blue wavelength band (for example 470 nm).

Specific examples of preferred ratios for forming the active layers are now set forth. These examples may be used for both single and multiple quantum well structures. First, for forming a well layer of a blue device, the ratio of the well layer should be $Mg_{0.2}Zn_{0.4}Cd_{0.4}Se$. The ratio for a barrier layer is $Mg_{0.2}Zn_{0.4}Cd_{0.4}Se$. It will be recognized by those skilled in the art that the multiple quantum well structure may be formed of plurality of well layers formed between barrier layers. Alternatively, for forming a blue laser, a ZnSe well layer may be formed with a ZnSSe barrier layer.

A preferred ratio for forming a green device is comprised of a well layer formed of $Mg_{0.1}Zn_{0.45}Cd_{0.45}Se$. The corresponding barrier layer is comprised of $Mg_{0.3}Zn_{0.35}Cd_{0.35}Se$. Alternatively, a well layer may be comprised of $Zn_{0.65}Cd_{0.35}Se$. The corresponding barrier layer is desirably comprised of ZnSSe. Again, it will be recognized by those skilled in the art that a multiple quantum well structure may be comprised of a plurality of well regions formed between barrier regions and a single quantum well structure will be comprised of a single well region sandwiched between two barrier regions. In each of the exemplarly embodiments, it should be noted that improved results were obtained from devices which did not include Te in the active layer. This is in part because a II–VI semiconductor comprising Te has a tendency to make clusters.

Figure 6:
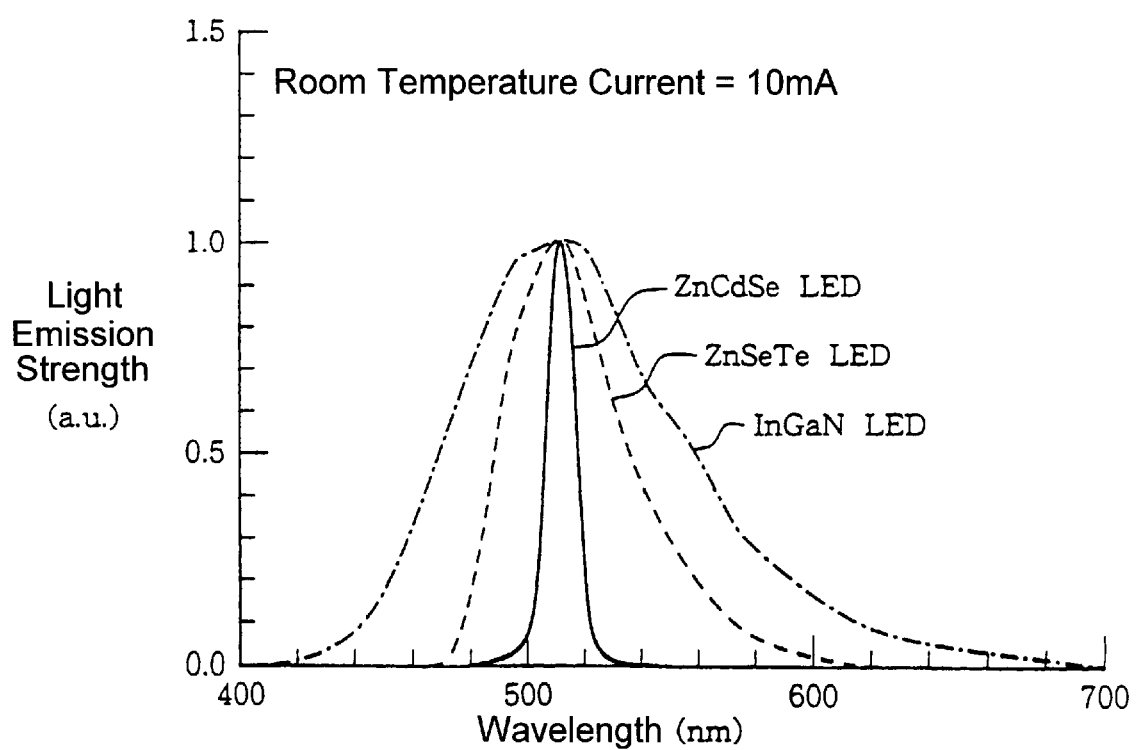
FIG. 6 is a characteristic view showing a light emission spectrum of a light emitting diode according to the invention and spectrum characteristics of other light emitting diodes.

FIG. 6 illustrates a light emission spectrum (blue) of a light emitting diode 10 made using the aforementioned ZnCdSe compound semiconductor compared with light emission spectra of light emitting diodes formed using other ZnSeTe and InGaN compound semiconductors. As is clear also from this figure, because the light emitting diode 10 according to this invention has a precursor delta function shaped spectrum having a half band width less than 30 nm and it has a limited peak value and an extremely narrow limited width, as described above even when the spectrum shape changes as it can be regarded purely as a magnitude change only. Although the embodiment described above is directed to a light emitting diode structure, it is recognized that laser diodes are also capable of being used or a combination of LEDs and LDs. The same is true of the embodiments described below.

Figure 7:
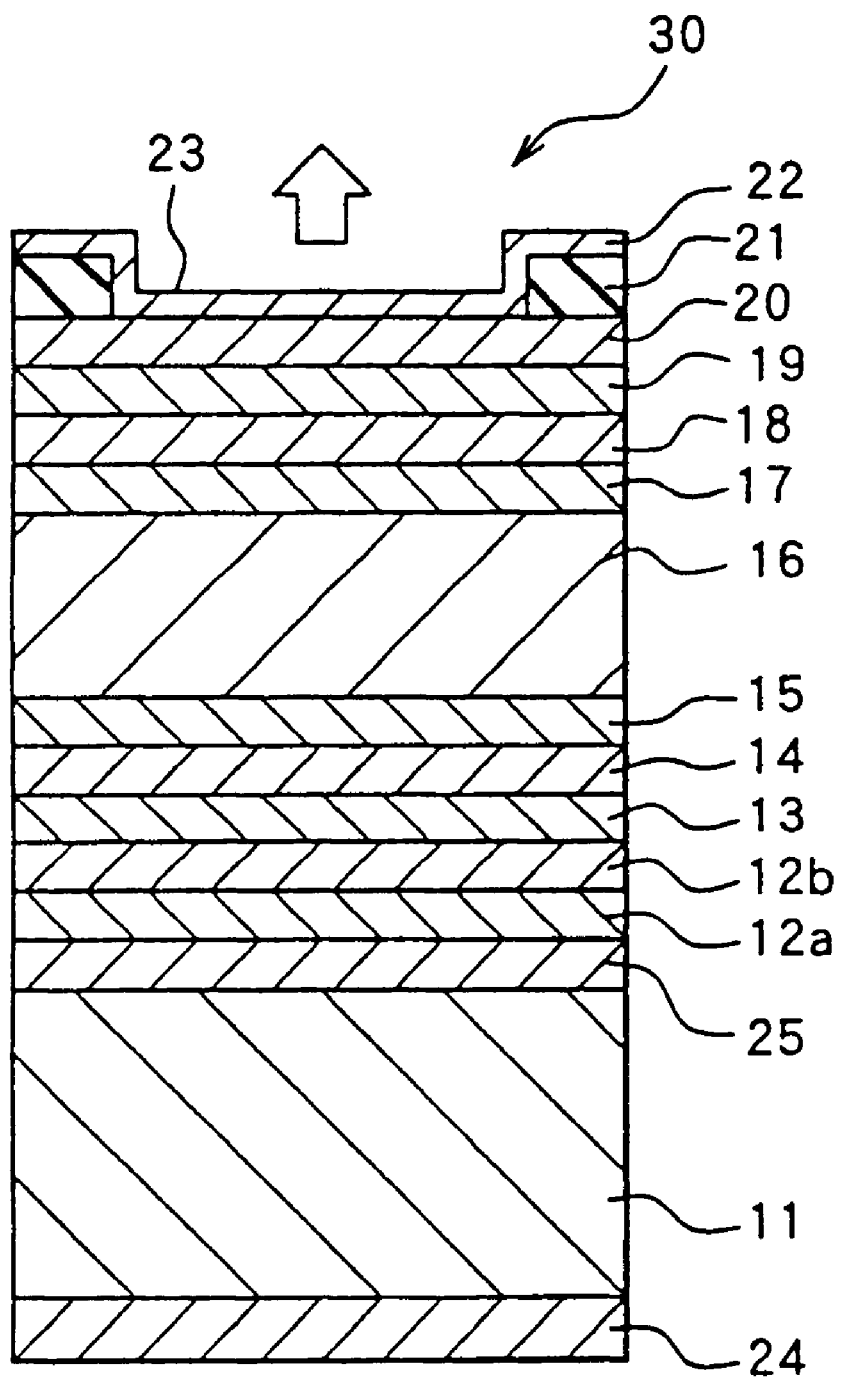
FIG. 7 is a sectional view showing the construction of a semiconductor laser according to a second embodiment of the present invention.

FIG. 7 illustrates the construction of a semiconductor device 30 according to a second exemplary embodiment of the invention. This semiconductor device 30 is comprised of a structure wherein a $Zn_xMg_yCd_{1-x-y}Se/Zn_pMg_qCd_{1-p-q}Se$ superlattice layer Bragg reflector layer 25 made by laminating $Zn_xMg_yCd_{1-x-y}Se$ ($0 \leq x, y \leq 1$) layers and $Zn_pMg_qCd_{1-p-q}Se$ ($0 \leq p, q \leq 1$) layers is inserted between the substrate 11 and the n-type clad layer 12 in the first embodiment. This Bragg reflector layer 25 can be formed by MBE or the like in the same way as the other layers. Constituent parts the same as in the first embodiment have been given the same symbols and their description has be omitted here.

In this exemplary embodiment, in the Bragg reflector layer 25, the thicknesses of the layers are set to ¼ of the light emission wavelength so that the reflectivity is maximum. Also, the number of repetitions of the layers is preferably made large to obtain a higher reflectivity.

With a construction wherein a Bragg reflector layer 25 has been inserted like this, there is a concern for the voltage drop becoming large, but by the hetero-interface being given a composition gradient, adding (doping) impurity at a high concentration, or providing a microcapacitor using delta doping, in actual operation it is possible to suppress the voltage drop and suppress deterioration of the light emission efficiency and deterioration of the device. Thus, promoting the realization of long life.

Figure 9:
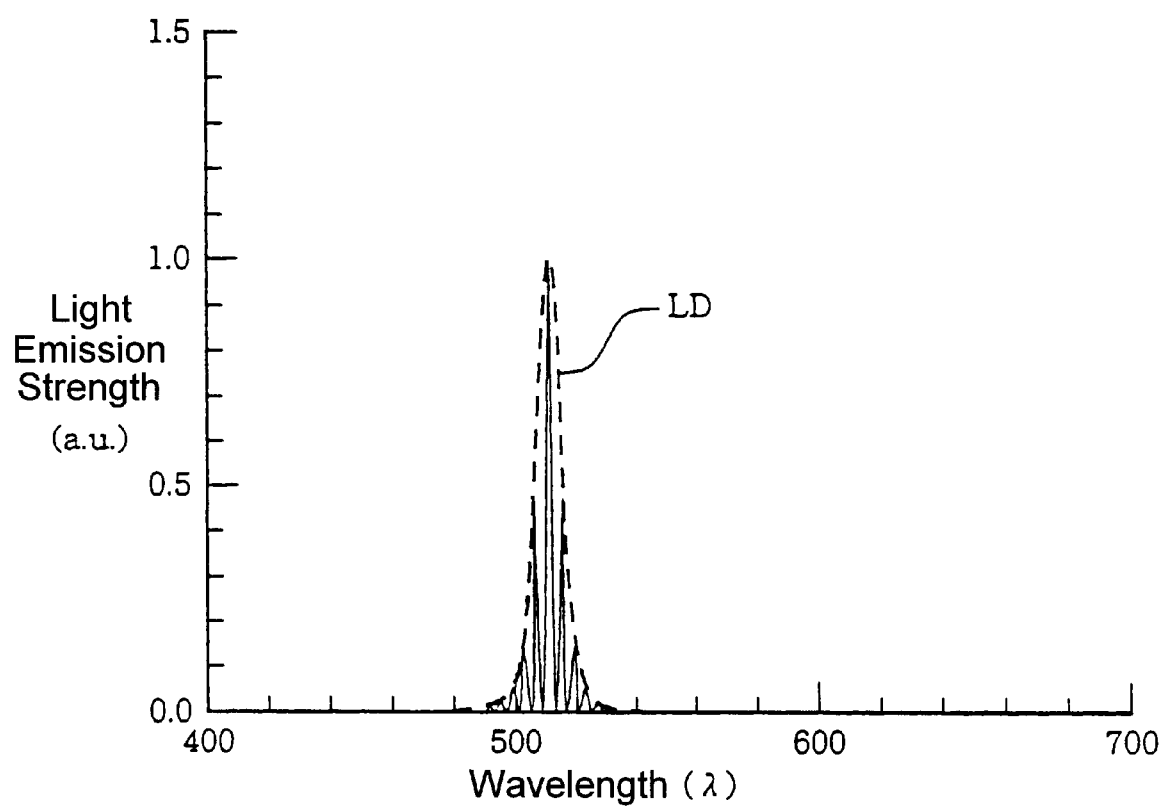
FIG. 9 is a characteristic view showing a light emission spectrum of a gain guided wave type semiconductor laser.

Also with the semiconductor device 30 of this embodiment, it is possible to obtain a green through blue precursor delta function shaped spectrum like in the first embodiment. Consequently, it is possible to suppress deterioration of the selfluminous display device and promote the realization of long life and obtain wide color reproducibility. When a gain guided wave type semiconductor laser (LD) has a stack structure (FIG. 4F), the light emission spectrum thereof becomes as shown in FIG. 9, but in this case all that is necessary is that the half band width of the envelope function shown with dashed lines be 30 nm or less.

Structures of semiconductor light emitting devices (LED, LD) comprised of group II–VI compound semiconductors have been described above, but they may also be made of other compound semiconductors, for example group III–V compound semiconductors.

Figure 8:
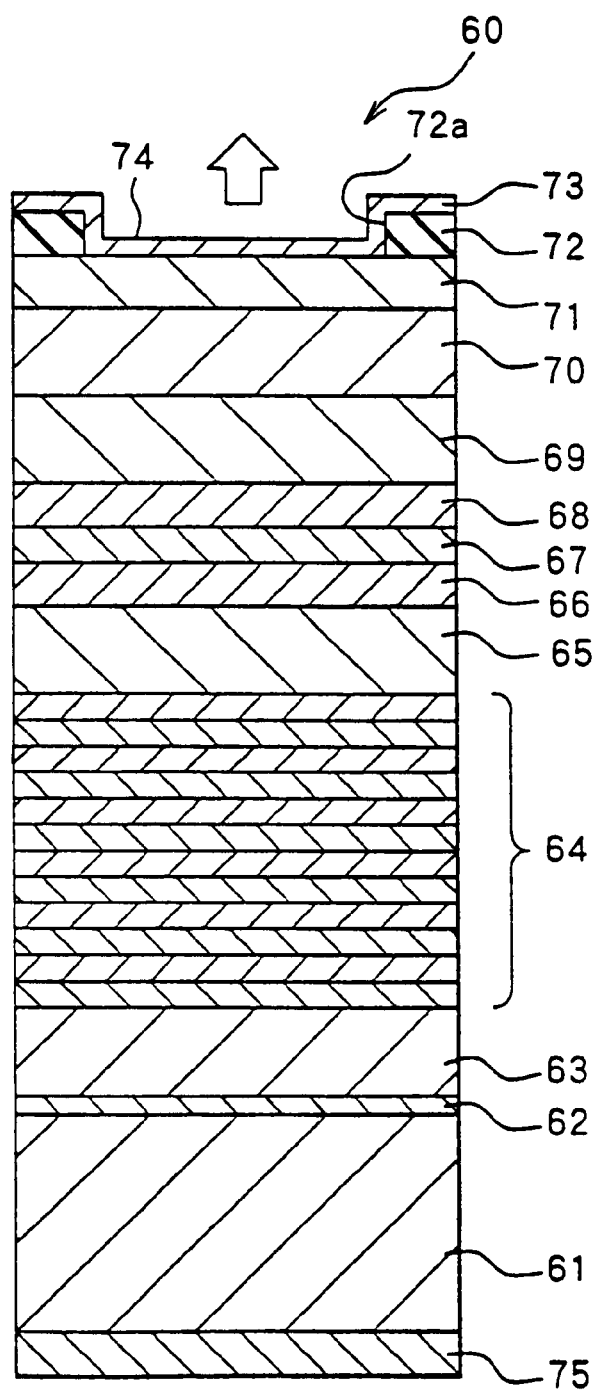
FIG. 8 is a sectional view showing the construction of a semiconductor laser according to a third embodiment of the present invention.

FIG. 8 shows the construction of a semiconductor laser 60 made of group III–V compound semiconductors according to a third exemplary embodiment of the invention. This semiconductor laser 60 is made by successively growing on, for example, an n-type substrate 61 made of SiC (silicon carbide) a buffer layer 62 comprised of a GaN or A/N layer having a thickness of about 10 to 200 nm doped with Cl as an n-type impurity. Then a GaN layer 63 having a thickness 100 to 500 nm similarly doped with Cl as an n-type impurity and a Bragg reflector layer 64 of a superlattice structure consisting of for example a $Ga_pIn_qN$ ($0 \leq p, q \leq 1$) layer and an $Al_{r'}Ga_{p'}In_{q'}N$ ($0 \leq p', q', r' \leq 1$) layer having a thickness about 30 to 50 nm repeatedly laminated are formed. Next, an n-type clad layer 65 having a thickness of about 1 nm, for example, comprised of $Al_{x1}Ga_{y1}In_{1-x1-y1}N$ ($0 \leq x1, y1 \leq 1$) doped with Si as an n-type impurity, an n-type guide layer 66 having a thickness of about 100 to 200 nm, for example, consisting of $Al_{x2}Ga_{y2}In_{1-x2-y2}N$ ($0 \leq x2, y2 \leq 1$) doped with Si as an n-type impurity, an active layer 67 of thickness for example 2 to 20 nm consisting of $Al_{x3}Ga_{y3}In_{1-x3-y3}N$ ($0 \leq x3, y3 \leq 1$) of a multiple quantum well structure, a p-type guide layer 68 of thickness about 100 to 200 nm for example consisting of $Al_{x2}Ga_{y2}In_{1-x2-y2}N$ ($0 < x2, y2 \leq 1$) with Mg doped p-type impurity, and a p-type clad layer 69 of thickness about 1 μm for example consisting of $Al_{x1}Ga_{y1}In_{1-x1-y1}N$ ($0 \leq x, y \leq 1$) doped with N as an n-type impurity are formed.

Also, a GaN layer 70 having a thickness of, for example, about 500 nm doped with Mg as a p-type impurity and a $Ga_{1-x}In_xN$ ($0 \leq x \leq 1$) layer 71 having a thickness of, for example, about slightly above 0 to 50 nm doped with Mg as a p-type impurity are successively grown on the p-type clad layer 69. The GaN layer 70 and $Ga_{1-x}In_xN$ layer 71 provide good ohmic contact with a p-side electrode. Also, an insulating film 72 of polyimide resin or the like is formed on the $Ga_{1-x}In_xN$ layer 71, and an opening 72a which becomes a current passage region is formed in this insulating film 72. A p-side electrode 73 comprised of laminated films of Ni (nickel) and Au (gold) is formed on the GaN or $Ga_{1-x}In_xN$ layer 71 including the insulating film 72 so as to surround a light emission surface 74. An n-side electrode 75 comprised of Ti (titanium) and Al (aluminum) or the like is formed on the rear side of the substrate 61. In this semiconductor light emitting device 60 also, the only difference is the compositions of the compounds and in the same way as in the light emitting diode of the first exemplary embodiment, it can manufactured using MBE and the like and photolithography technology.

In a semiconductor laser 60 according to this exemplary embodiment, like the first exemplary embodiment, it is possible to obtain green through blue precursor delta function shaped spectra and consequently it is possible to suppress deterioration of the selfluminous display device to promote the realization of long life and it is possible to obtain a wide range of color reproducibility in this device.

Specific ratios for forming the blue and green devices are as follows. The active layer of blue devices are desirably comprised of $Ga_{0.2}In_{0.8}N$. The guide layer is desirably comprised of GaN. Both clad layers are comprised of $Al_{0.1}Ga_{0.9}N$. The green device is comprised of $Ga_{0.5}In_{0.5}N$. The guide layers are desirably comprised of GaN, both clad layers comprise $Al_{0.1}Ga_{0.9}N$.

In a further exemplary embodiment, a red laser diode is formed by applying an n-type metal layer to a substrate comprised of n-InAs. Next, an n-cladding layer is formed on the InAs substrate. The n-cladding layer is comprised of n-$MgSe_{0.66}Te_{0.34}$. An active layer is then formed on the n-cladding layer which is comprised of CdSe. Subsequently, a p-clad layer which is comprised of $MgSe_{0.66}Te_{0.34}$ is formed on the n-clad layer. Finally, a p-metal base layer is formed on the p-cladding layer to form the red emitting laser diode. Alternatively, the red laser may be formed as follows.

First, an n-type metal layer is formed on an GaAs substrate. Then, an n-type clad layer comprised of $Al_{0.42}Ga_{0.58}As$ is formed on the clad layer. An active layer is then formed on the cladding layer which is comprised of $Al_{0.35}Ga_{0.65}As$. This is followed by a cladding layer comprised of p-$Al_{0.42}Ga_{0.58}As$. Finally, this is followed by a p-GaAs layer and an outer p-metal layer.

The invention has been described above with reference to exemplary embodiments, but the invention is not limited to the exemplary embodiments described above and may be modified in a scope equivalent thereto. For example, the compositions and so on of the layers comprising the semiconductor light emitting devices (LED, LD) described above can be different from the specific exemplary embodiments described above. That is, the group II–VI compound semiconductor light emitting devices shown in the exemplary embodiments described above can be made of various crystalline structures in which are used as a group II element one or more elements among the set consisting of Zn (zinc), Hg (mercury), Cd (cadmium), Mg (magnesium), Be (beryllium) and as group VI elements one or more among the set consisting of S (sulfur), Se (selenium), Te (tellurium).

Similarly, group III–V compound semiconductor light emitting devices also can be made from various crystalline structures in which are used as a group III element one or more elements among the set consisting of Al (aluminum), Ga (gallium), In (indium) and as a group V element one or more elements among the set consisting of N (nitrogen) and As (arsenic).

Also, although in the exemplary embodiments described above mainly surface emission type semiconductor light emitting devices were described, it is needless to say that the LED may be an end surface emission type.

Furthermore, although as semiconductor lasers, in the exemplary embodiments described above, gain guided wave type LEDs wherein current is injected into only a part of the active layer structurally were described, it can also be applied to refractive index guided wave types wherein a difference in refractive index is actively provided in the width direction of the active layer.

Also, the spectrum half band width (and the half band width of the envelope function) of the light emission sources constituting a selfluminous display device of the present invention can be made 30 nm or more if the reproducibility range on the chromaticity diagram is slightly sacrificed.

As described above, with a selfluminous display device according to the invention, because it was made to comprise a plurality of light emission sources having spectra of such levels that they do not mutually substantially overlap, light emission magnitude alone becomes the sole parameter and it is sufficient to correct only the magnitude. It is therefore possible to realize a display device of a digital character having no color quality deterioration and having good color reproducibility. Also, because the spectral half band widths are small, it is possible to reproduce points on the chromaticity diagram with superior point precision, and it is possible to realize a display device having the maximum reproducibility range on a chromaticity diagram.

We claim as our invention:

1. A selfluminous display device comprising:
    a plurality of red, green, and blue light emission sources, each of said red, green, and blue sources having spectra levels that substantially do not mutually overlap and respectively having a spectra half band width which is 30 nm or less.

2. The selfluminous display device according to claim 1, wherein said light emission sources comprising red, green and blue light emission sources respectively have precursor delta function shaped spectra of half band width 30 nm or less.

3. The selfluminous display device according to claim 1, wherein at least one of said light emission sources comprises a light emitting diode.

4. The selfluminous display device according to claim 3, wherein said light emitting diode is a surface emission type LED.

5. The selfluminous display device according to claim 3, wherein said light emitting diode is comprised of at least a clad layer and an active layer of a first conductive type and a clad layer of a second conductive type comprised of a group II–VI compound semiconductor.

6. The selfluminous display device according to claim 3, wherein said light emitting diode is comprised of at least a clad layer and an active layer of a first conductive type and a clad layer of a second conductive type comprised of a group II–V compound semiconductor.

7. The selfluminous display device according to claim 1, wherein at least one of said light emission sources is a semiconductor laser.

8. The selfluminous display device according to claim 7, wherein said semiconductor laser is a surface emission type semiconductor laser.

9. The selfluminous display device according to claim 7, wherein said semiconductor laser comprises at least a clad layer and an active layer of a first conductive type and a clad layer of a second conductive type comprised of a group II–VI compound semiconductor.

10. The selfluminous display device according to claim 7, wherein said semiconductor laser is comprised of at least a clad layer and an active layer of a first conductive type and a clad layer of a second conductive type comprised of a group III–V compound semiconductor.

11. The selfluminous display device according to claim 1, wherein said emission sources are comprised of semiconductor lasers including lasers having red, green or blue light emissions each having a spectra wherein the half band width of the envelope function is 30 nm or less.

12. The selfluminous display device according to claim 11, wherein said semiconductor lasers are surface emission type lasers.

13. The selfluminous display device according to claim 11, wherein said semiconductor lasers are comprised of at least a clad layer and an active layer of a first conductivity type and a clad layer of a second conductivity type comprised of a group II–VI compound semiconductor.

14. The selfluminous display device according to claim 11, wherein said semiconductor laser are comprised of at least a clad layer and an active layer of a first conductivity type and a clad layer of a second conductivity type comprised of a group III–V compound semiconductor.

* * * * *